(12) United States Patent
Kuo

(10) Patent No.: US 12,235,156 B2
(45) Date of Patent: Feb. 25, 2025

(54) OPTICAL SENSING DEVICE

(71) Applicant: Seer Microelectronics, Inc., Hsinchu County (TW)

(72) Inventor: Ming-Ching Kuo, Hsinchu County (TW)

(73) Assignee: SEER MICROELECTRONICS, INC., Hsinchu County (TW)

( * ) Notice: Subject to any disclaimer, the term of this patent is extended or adjusted under 35 U.S.C. 154(b) by 0 days.

(21) Appl. No.: 18/518,521

(22) Filed: Nov. 23, 2023

(65) Prior Publication Data

US 2024/0319007 A1  Sep. 26, 2024

Related U.S. Application Data

(60) Provisional application No. 63/427,610, filed on Nov. 23, 2022.

(51) Int. Cl.
*G01J 1/44* (2006.01)
*H04N 25/773* (2023.01)
*H10F 77/00* (2025.01)

(52) U.S. Cl.
CPC .............. *G01J 1/44* (2013.01); *H04N 25/773* (2023.01); *H10F 77/959* (2025.01)

(58) Field of Classification Search
CPC .... H04N 25/77; H04N 25/773; G01S 7/4863; G01S 17/10; G01S 17/89; H01L 31/02027
See application file for complete search history.

(56) References Cited

U.S. PATENT DOCUMENTS

| 2019/0113385 A1* | 4/2019 | Fukuchi ................ H01L 31/107 |
| 2020/0084396 A1* | 3/2020 | Kuroda ............. H01L 27/14643 |
| 2022/0026536 A1* | 1/2022 | Ozawa .................. G01S 17/931 |

FOREIGN PATENT DOCUMENTS

| CN | 114114209 A | 3/2022 |
| TW | 201339591 A | 10/2013 |
| TW | 202219489 A | 5/2022 |

OTHER PUBLICATIONS

Taiwan Intellectual Property Office Office Action Search Report on Nov. 5, 2024.

* cited by examiner

*Primary Examiner* — Georgia Y Epps
*Assistant Examiner* — Monica T Taba
(74) *Attorney, Agent, or Firm* — WPAT, PC

(57) ABSTRACT

An optical sensing device is provided. The optical sensing device includes an optical sensing element and a detection circuit. The optical sensing element senses an incident photon and generates a sensing signal. The detection circuit detects a pulse width of the sensing signal, and generates a reset signal when the pulse width is larger than a threshold value. Thereby, the optical sensing device is reset according to the reset signal and a dynamic range of the optical sensing device under strong ambient light will be further improved.

11 Claims, 8 Drawing Sheets

OPTICAL SENSING DEVICE

FIELD OF THE INVENTION

The present application relates to an electronic device, in particular to an optical sensing device.

BACKGROUND OF THE INVENTION

With the advancement of modern technology, electronic apparatuses have more versatile designs and applications according to the needs of life. In order to improve safety, convenience, and entertainment of life, distance detection technology plays an indispensable role, such as Time of Flight (ToF).

Distance measurement may be realized by optical sensing elements, which utilize optoelectronic conversion to convert the received optical signals into electrical signals and measure the time of flight. One of the optical sensing elements commonly used in the industry is the Single Photon Avalanche Diode (SPAD) element which is an optical detector with high sensitivity and able to detect a single photon. After the SPAD element is triggered by the photon, the voltage level of the SPAD element may return to its original state after the procedure of quenching and recharging and may wait for the next photon triggering.

Under strong ambient light, the conventional SPAD element may fail to sense the incident photons and output corresponding sensing signals for a longer period, as called the blinding condition. The conventional SPAD element with a passive quench/recharging circuit has charging and discharging currents which are lower than a threshold of latching current for preventing from the latching effect of SPAD element. Thus, the cycle time from triggered by photons to returning to its original state by quenching and recharging takes much longer so that the SPAD element has a long deadtime and low dynamic range. Under strong ambient light, the SPAD element with the passive quench/recharging circuit is more likely to suffer from the problem of multi-triggering, resulting in the SPAD element being unable to detect the incident photons and output corresponding sensing signals for a long period. Since the dynamic range of the SPAD element with the passive quench/recharging circuit is lower, the SPAD element with an active quench/recharging circuit has been developed to improve the problem of long dead time.

Once triggered by the incident photons, the SPAD element with active quench/recharging circuit will be quenched for a hold-off time and then quickly recharged to the original state to wait for triggering of next incident photons. Thereby, SPAD elements with active quench/recharging circuit may have a lower dead-time and a better dynamic range for light detection.

To shorten the recharging time, the current of the recharging circuit during a recharging period may be greater than a latching current of the SPAD element. During the recharging period when the voltage level of the SPAD element has not been recharged to the original state, once the SPAD element is triggered by another photon, the voltage level of the SPAD element may be latched, making it impossible to return to the original state. Thereby, the SPAD element cannot operate properly.

Thus, there exists a need for the industry to solve the problems of multi-triggering and SPAD latching as well as to improve the sensing capability and optical dynamic range of the SPAD elements to adapt strong ambient light conditions.

SUMMARY

An object of the present application is to provide an optical sensing device, which detects a pulse width of sensing signals and generates a corresponding reset signal to reset the optical sensing device, thereby avoiding problems of being unable to detect incident photons and generate sensing signals for a long period of time and poor dynamic range due to SPAD latching or multi-triggering under strong ambient light. The dynamic range and photon count rate of the optical sensing device are both improved.

In order to achieve the above object, the present application is to provide an optical sensing device, which includes an optical sensing element and a detection circuit coupled to the optical sensing element. The optical sensing element senses an incident photon and generates a sensing signal. Then, the detection circuit detects a pulse width of the sensing signal and generates a reset signal when the pulse width is larger than a threshold value. Thereby, the reset signal will activate another quenching and recharging cycle of the optical sensing element to avoid the latching problem caused by triggering of the next incident photons during recharging period. Thereby dynamic range and photon count rate of the optical sensing element are further improved.

DETAILED DESCRIPTION

In order to learn features and functions of the present application more clearly, please refer to the following embodiments and detailed description.

Certain terms are used in the description and claims to refer to particular elements. Those skilled in the art should understand that hardware manufacturers may use different terms to refer to the same component. The specification and claims do not use the difference in name as a way to distinguish components, but use the difference in function of components as a criterion for distinguishing. "Include/Comprise" mentioned throughout the specification and claims is an open term, so it should be interpreted as "including but not limited to". In addition, the term "coupled" herein includes any direct and indirect means of connection. Therefore, if it is described that a first device is coupled to a second device, it means that the first device may be directly connected to the second device, or indirectly connected to the second device through other devices or connection means.

In order to solve the problems of the conventional optical sensing element having poor sensing capability and dynamic range, and being unable to detect incident photons and generate sensing signals for a long period due to the problems such as multi-triggering under strong ambient light, the present application provides an optical sensing device comprising a detection circuit detecting a pulse width of a sensing signal from an optical sensing element and generating a reset signal when the pulse width is larger than a threshold value. According to the reset signal, the optical sensing element is reset to quench and recharge and then returns to its original state to wait for next photon triggering. Thereby, the above-mentioned problems of poor sensing capability and dynamic range and being unable to detect incident photons and generate sensing signals for a long period may be solved.

The following embodiment and related figures are used to explain the present application in detail, not intended to limit the invention to those embodiments because the present application may have different implementations of the same concept.

Figure 1:
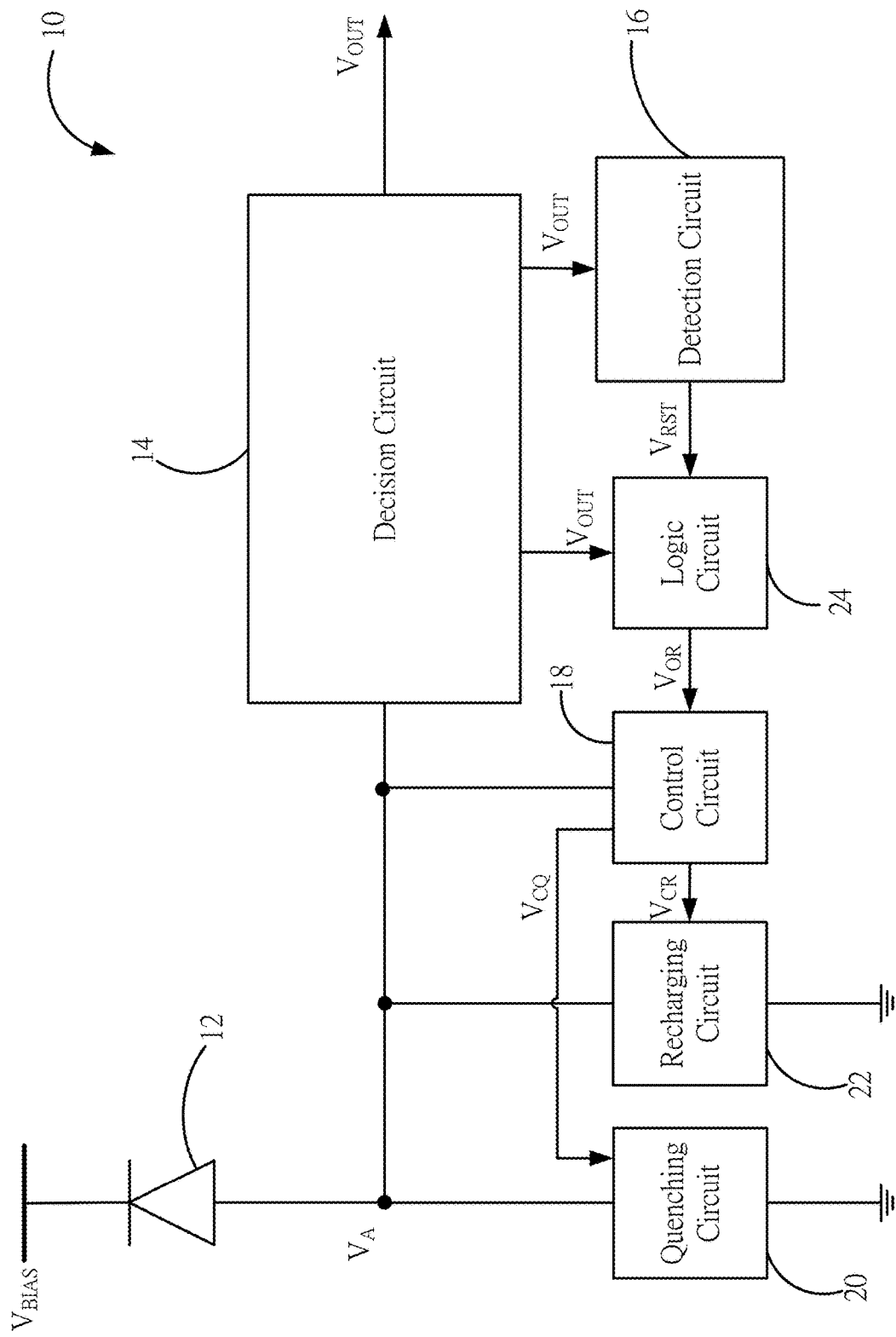
FIG. 1 is a schematic diagram showing an optical sensing device according to one embodiment of the present application.

First, refer to FIG. 1, a schematic diagram showing an optical sensing device according to one embodiment of the present application is provided. As shown in the figure, an optical sensing device 10 according to the present application includes an optical sensing element 12, a decision circuit 14, a detection circuit 16, a control circuit 18, a quench circuit 20 and a recharging circuit 22. Wherein, the optical sensing element 12 is coupled to the decision circuit 14, and coupled to the quench circuit 20 and the recharging circuit 22, and the decision circuit 14 is further coupled to the detection circuit 16. That is, the detection circuit 16 is coupled to the optical sensing element 12 through the decision circuit 14. The detection circuit 16 is coupled to the control circuit 18, and the control circuit 18 is coupled to the quench circuit 20 and the recharging circuit 22. In other words, the control circuit 18 may be coupled to the optical sensing element 12. The present application further detects a sensing signal $V_A$ of the optical sensing element 12 or controls the optical sensing element 12 through the control circuit 18. The operation of the optical sensing device 10 is described in detail below.

Figure 2:
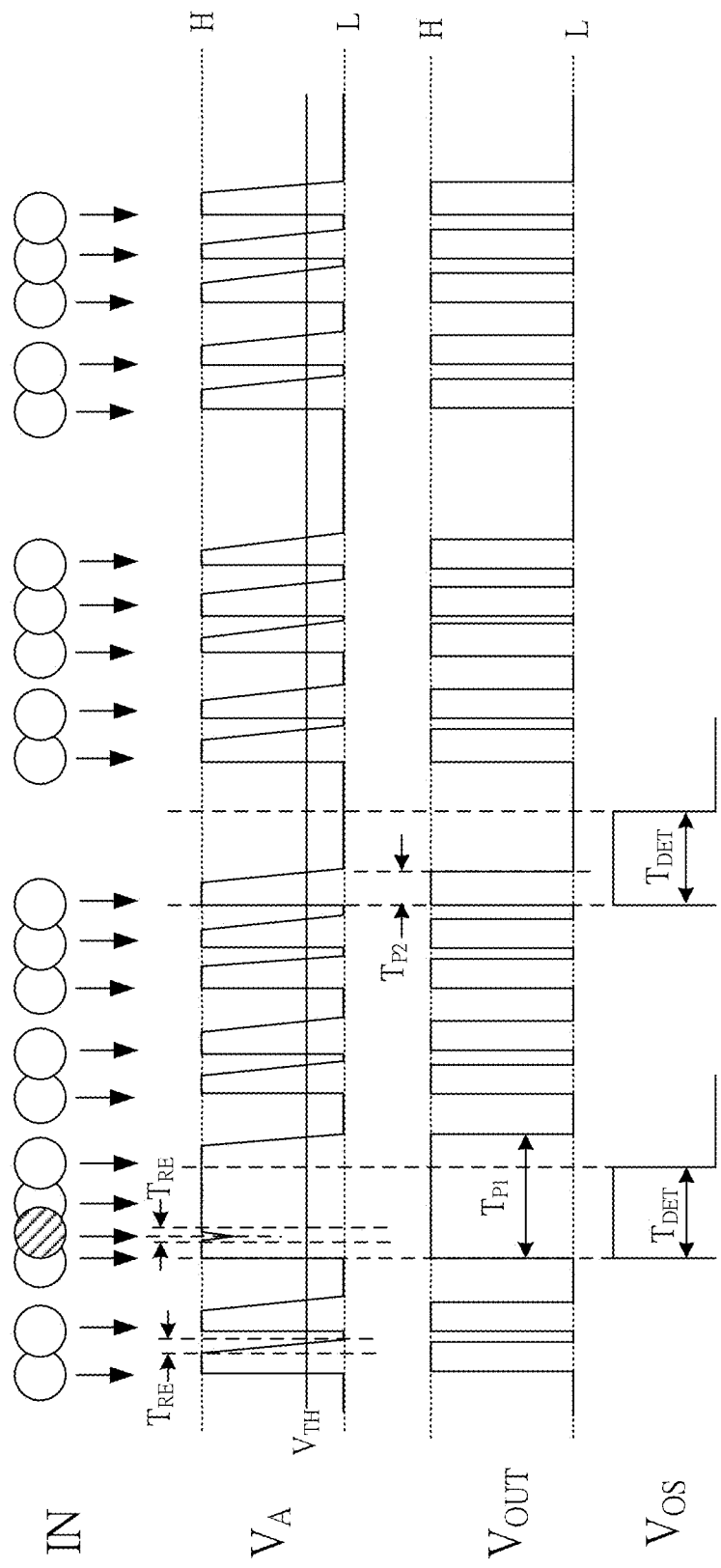
FIG. 2 is a schematic diagram showing sensing signals vs output signals according to one embodiment of the present application.
Figure 3A:
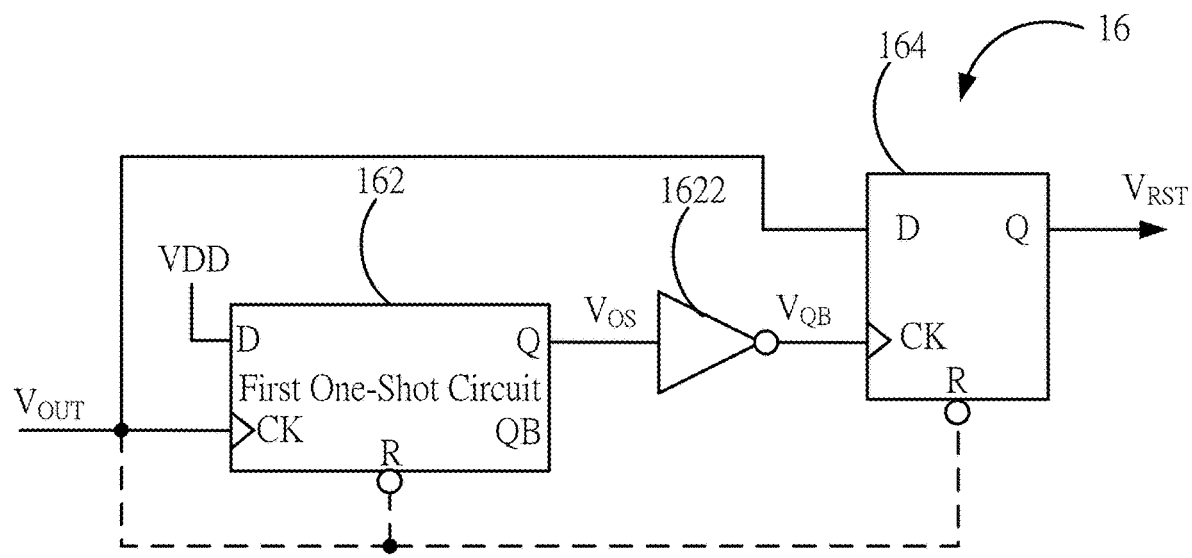
FIG. 3A is a circuit diagram showing detection circuit according to one embodiment of the present application.
Figure 3B:
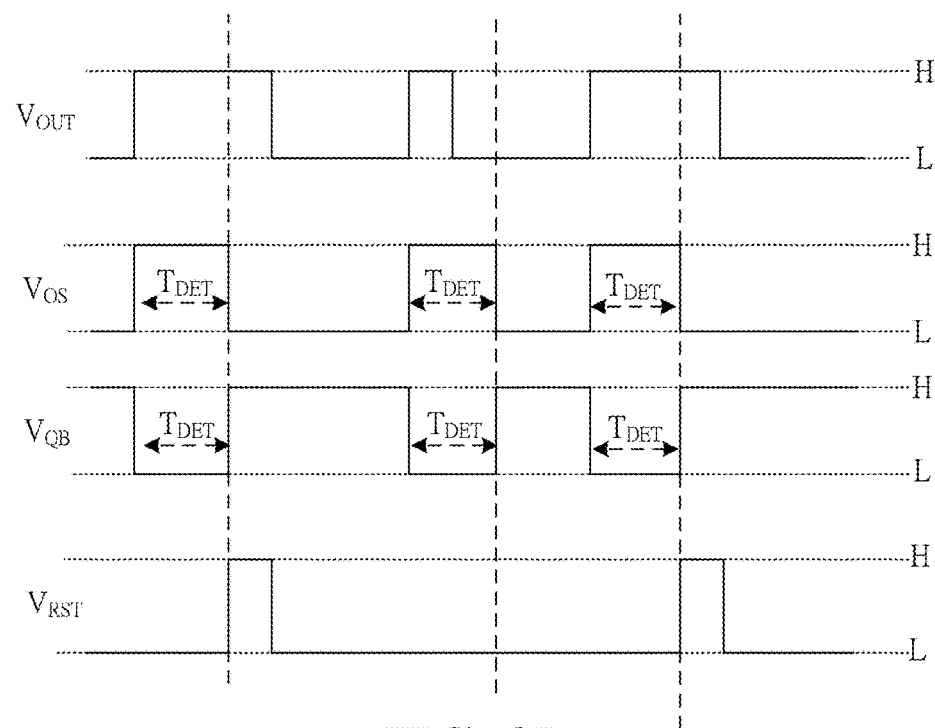
FIG. 3B is a schematic diagram showing the output signals, the one-shot signals, and the reset signals according to one embodiment of the present application.

Refer to FIG. 2, FIG. 3A, and FIG. 3B, which show schematic diagrams showing sensing signals vs output signals, detection circuit, and output signals, one-shot signals, and reset signals according to one embodiment of the present application. As shown in the figure, the optical sensing element 12 senses at least one incident photon IN and generates a sensing signal $V_A$. Then, the decision circuit 14 generates an output signal $V_{OUT}$ according to the sensing signal $V_A$ and a one-shot signal $V_{OS}$ is generated by the detection circuit 16 according to the output signal $V_{OUT}$. The detection circuit 16 compares the output signal $V_{OUT}$ with the one-shot signal $V_{OS}$. When a pulse width of the output signal $V_{OUT}$ at a high level H is a first pulse width $T_{P1}$, and the first pulse width $T_{P1}$ is larger than a pulse width of the one-shot signal $V_{OS}$, a time duration corresponding to the first pulse width $T_{P1}$ is larger than a trigger time $T_{DET}$ corresponding to the one-shot signal $V_{OS}$. This means the trigger time $T_{DET}$ is used as a threshold value of the detection circuit 16 for detecting the sensing signal $V_A$. The trigger time $T_{DET}$ may be corresponding to a deadtime of the optical sensing element 12, which means the deadtime may be set as a reference parameter of the trigger time $T_{DET}$ in circuit design. Generally, the deadtime is equivalent to a period during which the optical sensing element 12 completes a cycle from being triggered by a photon and then returned to its original state to wait for the next photon triggering. For example, the optical sensing element 12 is a single photon avalanche diode and the trigger time $T_{DET}$ may be larger than the deadtime of the optical sensing element 12.

Continued to above, when the time duration corresponding to the first pulse width $T_{P1}$ is larger than the trigger time $T_{DET}$, it means that the optical sensing element 12 may be triggered by another incident photon IN during the recharging period $T_{RE}$, leading to that a time duration of the output signal $V_{OUT}$ standing at the high level H is larger than the trigger time $T_{DET}$. Thereby, the detection circuit 16 generates a corresponding reset signal $V_{RST}$ for driving the control circuit 18 to control the quench circuit 20 and the recharging circuit 22 to activate another cycle of quenching and recharging on the optical sensing element 12. Thus, the avalanche current of the optical sensing element 12 triggered by the incident photon IN is quenched and a voltage level of the sensing signal $V_A$ is returned to its original level until the optical sensing element 12 being triggered by the next incident photon IN. Thereby a problem of the optical sensing element 12 being unable to respond incident photons IN and generate sensing signals $V_A$ for a long period of time due to trigger of another incident photon IN during the recharging period $T_{RE}$ may be solved. Some problems including SPAD latching, multi-triggering, etc. may thus be avoided.

Contrary to above, when a pulse width of the output signal $V_{OUT}$ is a second pulse width $T_{P2}$ and the second pulse width $T_{P2}$ is smaller than the pulse width of the one-shot signal $V_{OS}$, it means a time duration corresponding to the second pulse width $T_{P2}$ is smaller than a trigger time $T_{DET}$ corresponding to the one-shot signal $V_{OS}$. Such as, the detection circuit 16 does not generate the reset signal $V_{RST}$. That means the control circuit 18 does not be driven to control the quench circuit 20 and the recharging circuit 22 to activate another quenching and recharging on the optical sensing element 12 according to the reset signal $V_{RST}$. At this instant, the control circuit 18 controls the quench circuit 20 and the recharging circuit 22 to perform quenching and recharging on the optical sensing element 12 according to the output signal $V_{OUT}$. Thus, the sensing signal $V_A$ is returned to a ground level and maintained at the ground level until the next trigger of the optical sensing element 12 by next incident photon IN.

In this embodiment, a bias VBIAS serves as a reverse bias of the optical sensing element 12 as an example. A voltage level of the optical sensing element 12 before being triggered by the incident photon IN is maintaining at the ground level. After being triggered by the incident photon IN, a large current is instantaneously generated, and the voltage level of the optical sensing element 12 immediately rises to an excess bias ($V_{ex}$). Wherein, the excess bias ($V_{ex}$) is equivalent to the bias VBIAS minus a breakdown voltage ($V_{BD}$) of the optical sensing element 12. After quenching and recharging, the voltage level may be returned to the ground level until the optical sensing element 12 is triggered by the next incident photon IN. The optical sensing device 10 of present application further drives the control circuit 18 to control the quench circuit 20 and the recharging circuit 22 to perform quenching and recharging on the optical sensing element 12 according to the reset signal $V_{RST}$ when the time duration corresponding to the first pulse width $T_{P1}$ is larger than the time duration corresponding to the one-shot signal $V_{OS}$. That means the voltage level may be returned to the ground level until the optical sensing element 12 is triggered by the next incident photon IN so as to avoid the above problems, such as multi-triggering and SPAD latching.

The operation and circuit diagram of the detection circuit 16 is revealed in the following in order to illustrate the operation of the detection circuit 16 generating the reset signal $V_{RST}$.

Refer to FIG. 1, FIG. 3A and FIG. 3B again, the detection circuit 16 comprises a first one-shot circuit 162 and a first flip-flop 164. A clock input terminal CK of the first one-shot circuit 162 is coupled to the decision circuit 14 and thus receiving the output signal $V_{OUT}$. According to the output signal $V_{OUT}$, the first one-shot circuit 162 generates the one-shot signal $V_{OS}$ at a positive output terminal Q. The one-shot signal $V_{OS}$ is inverted by an inverter 1622 to form an inverted trigger signal $V_{QB}$ which is input into a clock input pin CK of the first flip-flop 164. An input pin D and a reset pin R of the first flip-flop 164 are coupled to the decision circuit 14 and thus receiving the output signal $V_{OUT}$. When the output signal $V_{OUT}$ is changed from the low level L to the high level H, which means the level of the output signal $V_{OUT}$ is changed to form a positive edge, the first one-shot circuit 162 is triggered to output the one-shot signal $V_{OS}$ with the high level H. After a trigger time $T_{DET}$, the one-shot signal $V_{OS}$ is changed from the high level H to the low level L. The above change is equivalent to a transition from 1 to 0 in digital signal format so that the inverted trigger signal $V_{QB}$ is changed from the low level L to the high level H. Then, the first flip-flop 164 generates the reset signal $V_{RST}$ according to the voltage level of the output signal $V_{OUT}$. That means the first flip-flop 164 compares the pulse width of the output signal $V_{OUT}$ to the pulse width of the one-shot signal $V_{OS}$ and pulls high the reset signal $V_{RST}$ when the output signal $V_{OUT}$ has been at the high level H for a period of time greater than the trigger time $T_{DET}$. Moreover, the first one-shot circuit 162 may generate the inverted trigger signal $V_{QB}$ at an inverted output terminal QB and sends the inverted trigger signal $V_{QB}$ to the first flip-flop 164 according to the output signal $V_{OUT}$.

As to above, for example, the output signal $V_{OUT}$ is changed from the low level L to the high level H, which is equivalent to the transition from 0 to 1 in digital signal format, when the optical sensing element 12 is triggered by the incident photon IN. Thus a positive rising edge which is formed due to transition from the low level L to the high level H drives the first one-shot circuit 162 to generate the one-shot signal $V_{OS}$. After the trigger time $T_{DET}$, the one-shot signal $V_{OS}$ is changed from the high level H to the low level L, which is equivalent to the transition from 1 to 0 in digital signal format. This leads to a change of the inverted trigger signal $V_{QB}$ from the low level L to the high level H which is equivalent to the transition from 0 to 1 in digital signal format. Thereby the first flip-flop 164 starts to generate the reset signal $V_{RST}$ according to the output signal $V_{OUT}$. More particularly, when the output signal $V_{OUT}$ is still at the high level H, which is equivalent to 1 in digital signal format, the reset signal $V_{RST}$ is changed from a low level L to a high level H until the output signal $V_{OUT}$ is changed from the high level H to the low level L and the first flip-flop 164 is reset. Then the reset signal $V_{RST}$ is changed from the high level H to the low level L.

Again, refer to FIG. 1, the optical sensing device 10 according to the present application further comprises a logic circuit 24 which is coupled between the decision circuit 14 and the control circuit 18, further coupled between the detection circuit 16 and the control circuit 18. The logic circuit 24 respectively receives the output signal $V_{OUT}$ and the reset signal $V_{RST}$ so as to generate a confirmation signal $V_{OR}$ to the control circuit 18 according to the output signal $V_{OUT}$ and the reset signal $V_{RST}$. Thereby the optical sensing device 10 integrates the output signal $V_{OUT}$ and the reset signal $V_{RST}$ into the confirmation signal $V_{OR}$ by the logic circuit 24 for driving the control circuit 18 to control the quench circuit 20 and the recharging circuit 22 for active quenching and recharging of the optical sensing element 12 after the optical sensing element 12 being triggered by the incident photon IN.

Next, the operation of the control circuit 18 controlling the quench circuit 20 and the recharging circuit 22 for quenching and recharging of the optical sensing element 12 is revealed below.

Figure 4A:
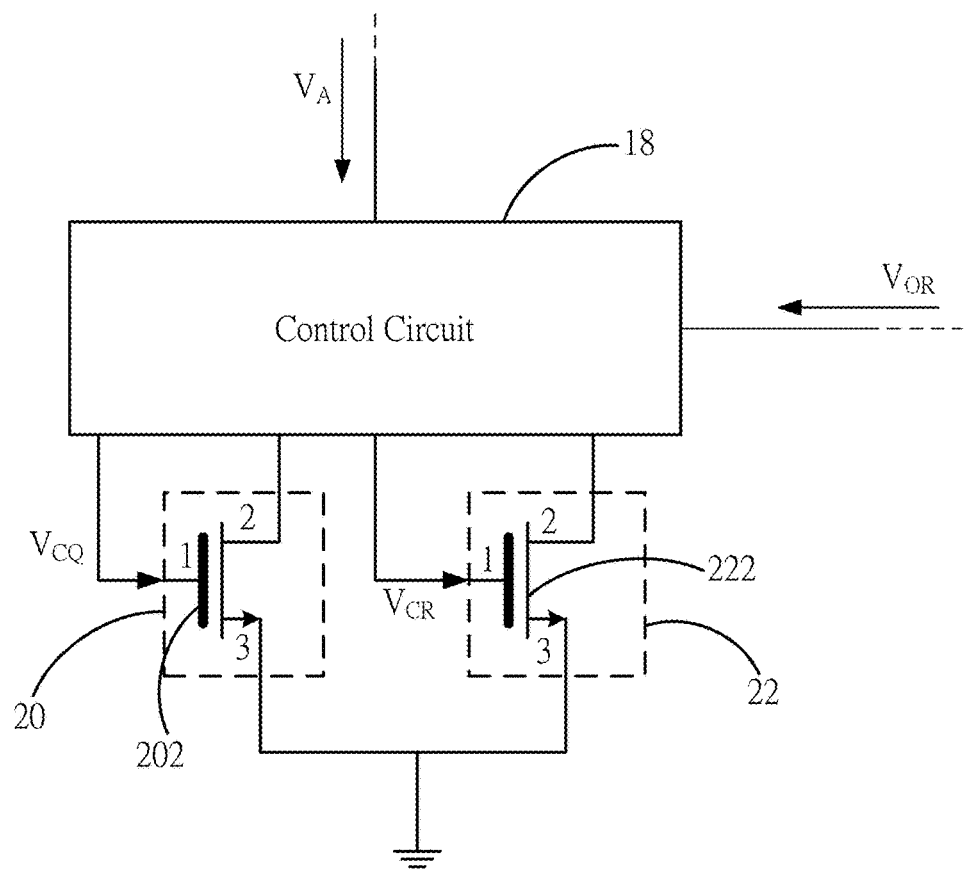
FIG. 4A is a schematic diagram showing the control circuit coupled to the quench circuit and the recharging circuit according to one embodiment of the present application.
Figure 4B:
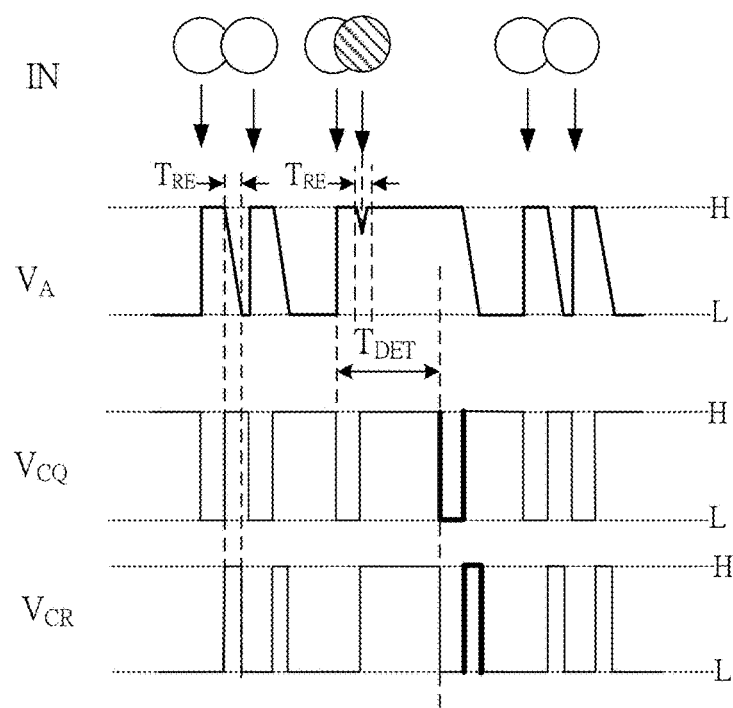
FIG. 4B is a schematic diagram showing the quench control signals and the recharging control signals according to one embodiment of the present application.

Again, refer to FIG. 1, and refer to FIG. 4A, and FIG. 4B, which are schematic diagrams showing the control circuit coupled to the quench circuit and the recharging circuit, and quench control signals and recharging control signals according to one embodiment of the present application. As shown in the figures, the control circuit 18 is coupled to the optical sensing element 12 and the logic circuit 24 and thus receiving the sensing signal $V_A$ and the confirmation signal $V_{OR}$. According to the sensing signal $V_A$ and the confirmation signal $V_{OR}$, the control circuit 18 generates a quench control signal $V_{CQ}$ and a recharging control signal $V_{CR}$ which are respectively sent to the quench circuit 20 and the recharging circuit 22. The quench circuit 20 includes a quench transistor 202, and the recharging circuit 22 includes a recharging transistor 222. A first terminal of the quench transistor 202 and a first terminal of the recharging transistor 222 respectively receives the quench control signal $V_{CQ}$ and the recharging control signal $V_{CR}$ to control whether a second terminal and a third terminal of the quench transistor 202 are conducting and a second terminal and a third terminal of the recharging transistor 222 are conducting for control of the voltage level of the sensing signal $V_A$.

Furthermore, the control circuit 18 controls the quench circuit 20 and the recharging circuit 22 according to the confirmation signal $V_{OR}$. In this embodiment, the confirmation signal $V_{OR}$ is corresponding to the output signal $V_{OUT}$ or the reset signal $V_{RST}$. Especially as shown in FIG. 2, FIG. 3B, and FIG. 4B, when a voltage level of the output signal $V_{OUT}$ corresponding to the sensing signal $V_A$ is still at the high level H after the trigger time $T_{DET}$, the reset signal $V_{RST}$ is pulled high for driving the control circuit 18 to control the quench circuit 20 for quenching the optical sensing element 12, and then control the recharging circuit 22 for recharging the optical sensing element 12 after a hold-off time. That means when a pulse width of the output signal $V_{OUT}$ corresponding to the sensing signal $V_A$ with the high level H is larger than the trigger time $T_{DET}$, the control circuit 18 immediately controls the quench transistor 202 of the quench circuit 20 to quench the optical sensing element 12 while the trigger time $T_{DET}$ is end, and then controls the recharging transistor 222 of the recharging circuit 22 to recharge the optical sensing element 12 after a hold-off time. Thus, the sensing signal $V_A$ will return to its voltage level as before the incident photon IN triggers the optical sensing element 12 such as the ground level (zero level) and the optical sensing element 12 may be ready for the next trigger by the incident photon IN.

In the above embodiment, the logic circuit 24 may be an OR gate or a circuit component which achieves logic OR function. Moreover, the high level H and the low level L of the above sensing signal $V_A$ are respectively corresponding to an excess bias ($V_{ex}$) and the ground level. As to the rest circuit components such as the decision circuit 14, the detection circuit 16, etc., the high level H and the low level L of the output signal of them are corresponding to the power supply voltage (such as VDD) for circuit operation and the ground level. In the above embodiment, the detection circuit 16 is coupled to the optical sensing element 12 through the decision circuit 14. Thus the detection circuit 16 detects the output signal $V_{OUT}$ which is equivalent to the detection of the sensing signal $V_A$. Moreover, the detection circuit 16 may be directly coupled to the optical sensing element 12 to detect the pulse width of the sensing signal $V_A$. Thus the control circuit 18 controls the quench circuit 20 and the recharging circuit 22 according to the sensing signal $V_A$ or the reset signal $V_{RST}$ for quenching and recharging of the optical sensing element 12 so that the sensing signal $V_A$ may be returned to the voltage level as before the incident photon IN triggers the optical sensing element 12 such as the ground level (zero level) and the optical sensing element 12 will be ready for the next trigger by the incident photon IN.

In following embodiment, the decision circuit 14 comprises a plurality of inverters and the detailed description as described below.

Figure 5:
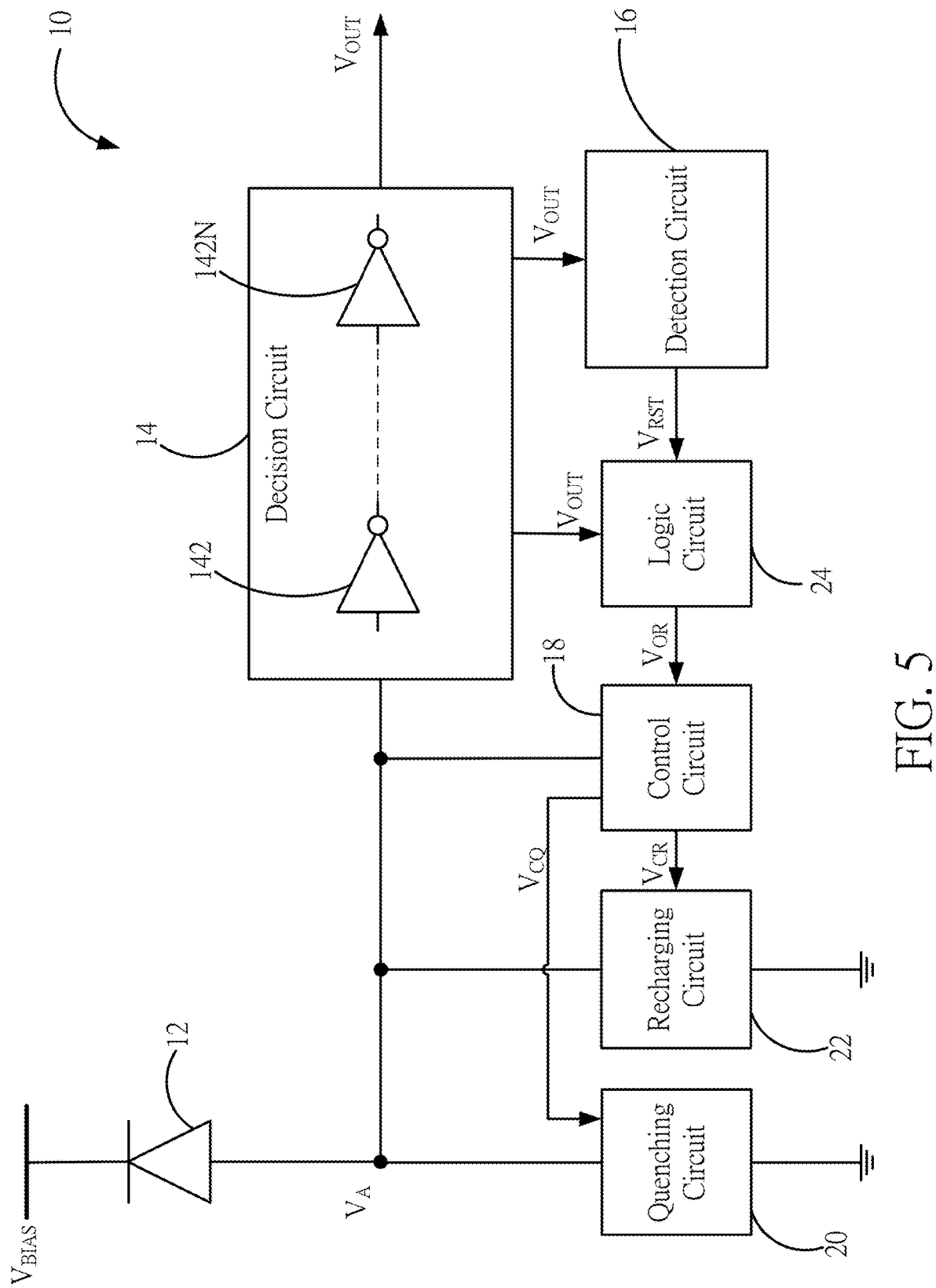
FIG. 5 is a schematic diagram showing the optical sensing device according to another embodiment of the present application.

Refer to FIG. 5, a schematic diagram of the optical sensing device according to another embodiment of the present application is provided. The difference between the embodiment in FIG. 1 and this one in FIG. 5 is in that the embodiment in FIG. 5 reveals that the decision circuit 14 includes a plurality of inverters ranging from the first inverter 142 to the N-th inverter 142N. That means the decision circuit 14 includes at least one inverter. For example, N is 2, i.e., the decision circuit 14 is configured by two inverters, including the second inverter 1422. When the number of inverters in the decision circuit 14 is an odd number, the output signal $V_{OUT}$ is corresponding to an inverted phase of the sensing signal $V_A$. Otherwise the output signal $V_{OUT}$ is corresponding to the sensing signal $V_A$ with the same phase.

Figure 6:
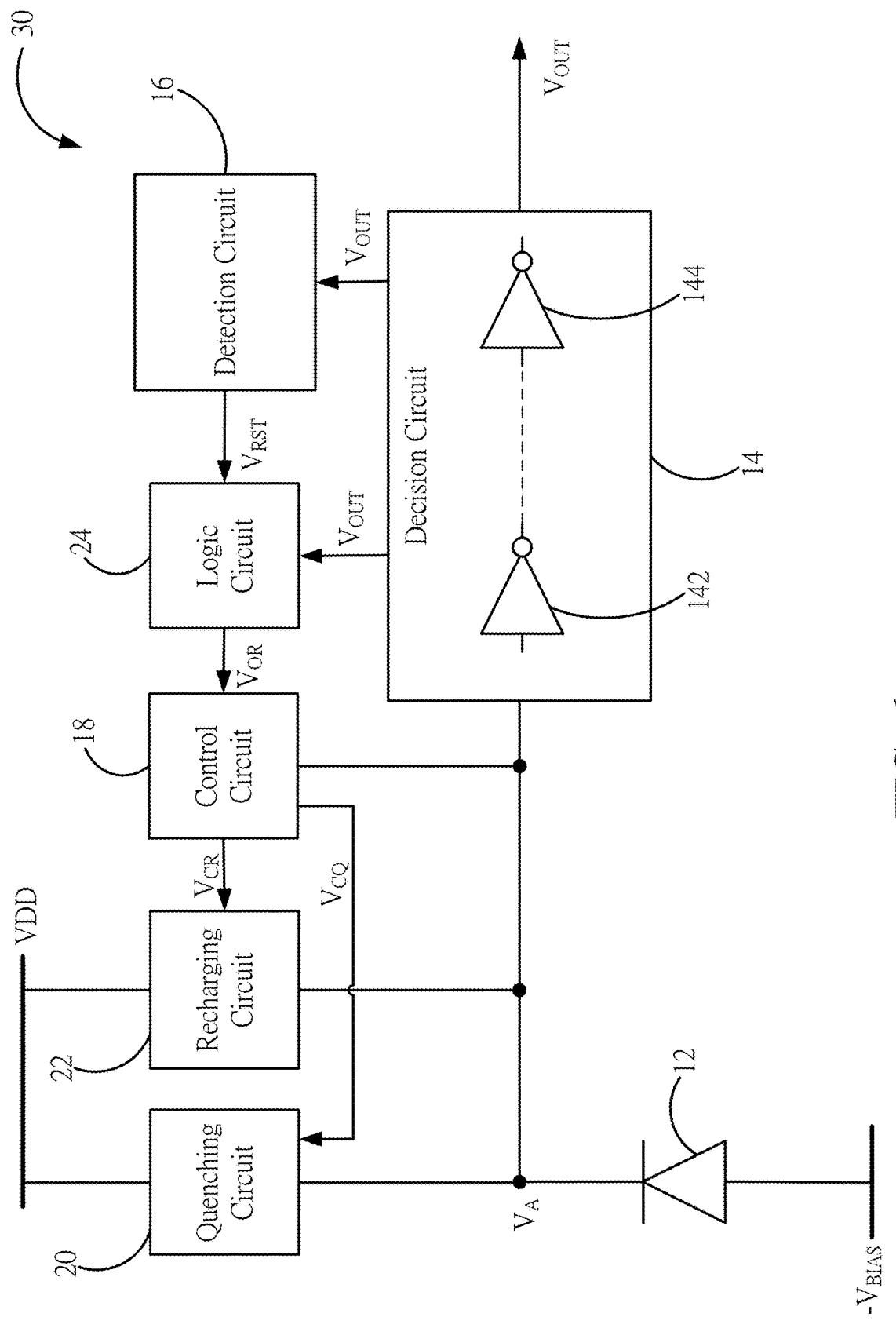
FIG. 6 is a schematic diagram showing the optical sensing device according to another embodiment of the present application.

Further, refer to FIG. 6, a schematic diagram of the optical sensing device according to another embodiment of the present application is provided. The embodiment in FIG. 6 and the embodiment in FIG. 5 are different in the connection of the optical sensing element 12. In the optical sensing device 10 as shown in FIG. 5, a cathode of the optical sensing element 12 is coupled to the bias VBIAS and an anode of the optical sensing element 12 is coupled to the decision circuit 14, the control circuit 18, the quench circuit 20, and the recharging circuit 22. Moreover, the quench circuit 20 and the recharging circuit 22 are coupled to the ground. As to an optical sensing device 30 shown in FIG. 6, an anode of the optical sensing element 12 is coupled to a negative bias-VBIAS and a cathode of the optical sensing element 12 is coupled to the decision circuit 14, the control circuit 18, the quench circuit 20, and the recharging circuit 22. Moreover, the quench circuit 20 and the recharging circuit 22 are coupled to a power supply voltage VDD. In the above optical sensing device 30, the high level H and the low level L of the sensing signal $V_A$ are respectively corresponding to the power supply voltage VDD and the ground level such as when the negative bias-VBIAS is equal to the negative breakdown voltage-$V_{BD}$ of the optical sensing element 12.

In the above embodiment, it is revealed that the optical sensing device 10 further drives the control circuit 18 through the reset signal $V_{RST}$ to control the quench circuit 20 and the recharging circuit 22 to perform quenching and recharging of the optical sensing element 12 when the time duration corresponding to the first pulse width $T_{P1}$ is larger than the time duration corresponding to the one-shot signal $V_{OS}$. Thereby the problem of being unable to respond incident photons IN to generate sensing signals $V_A$ for a long period of time due to SPAD latching or multi-triggering mentioned above may be solved. The dynamic range for light detection and photon count rate under strong ambient light are further improved. The decision circuit 14 of the optical sensing devices 10, 30 may further include a plurality of inverters or be implemented using a comparator circuit, but not limited.

Continued to above, moreover, the optical sensing device of the present application may further detect the voltage level of the sensing signals $V_A$ or the output signal $V_{OUT}$ continuously by feedback control.

Figure 7:
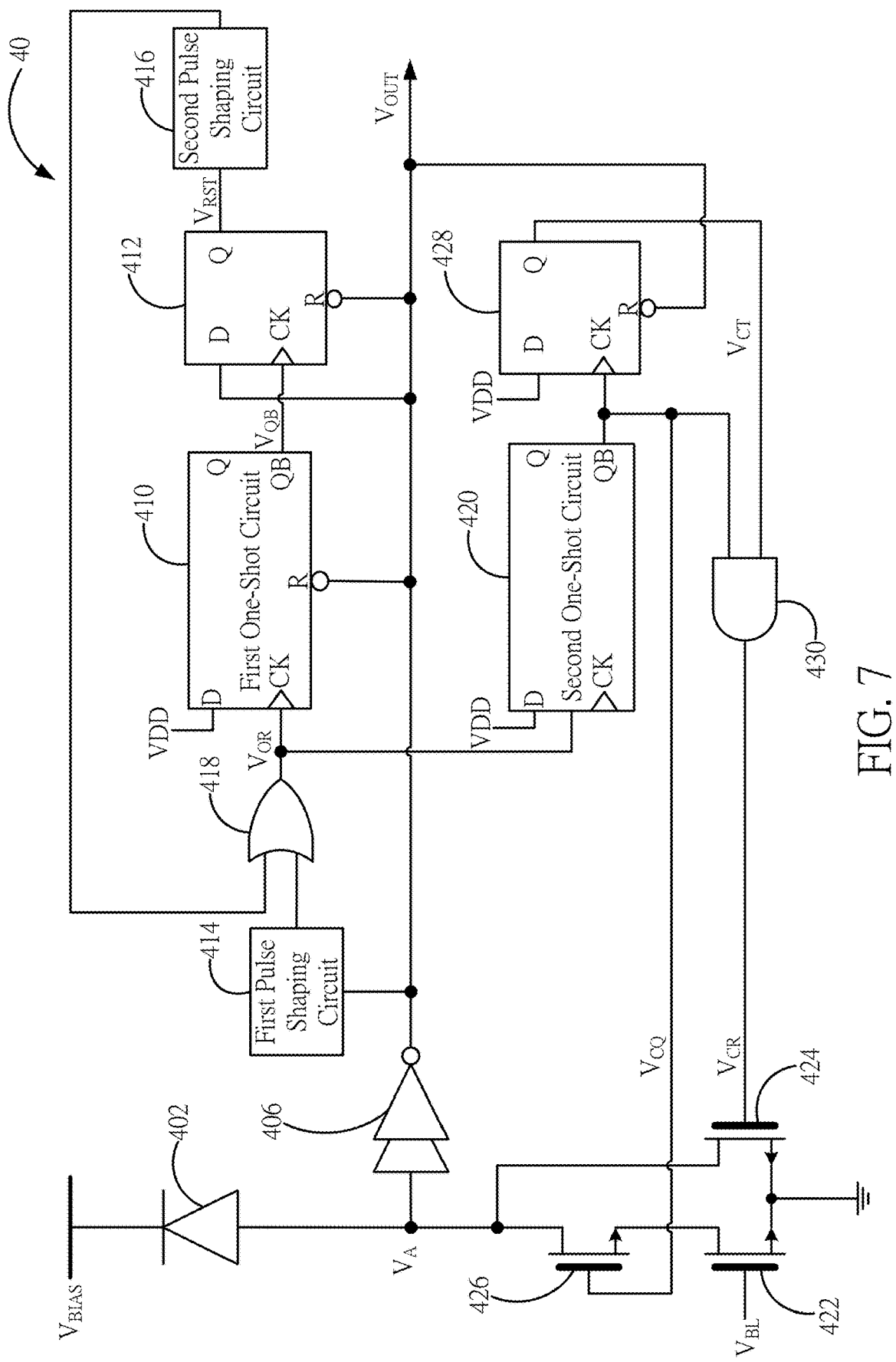
FIG. 7 is a schematic diagram showing the optical sensing device according to another embodiment of the present application.
Figure 8:
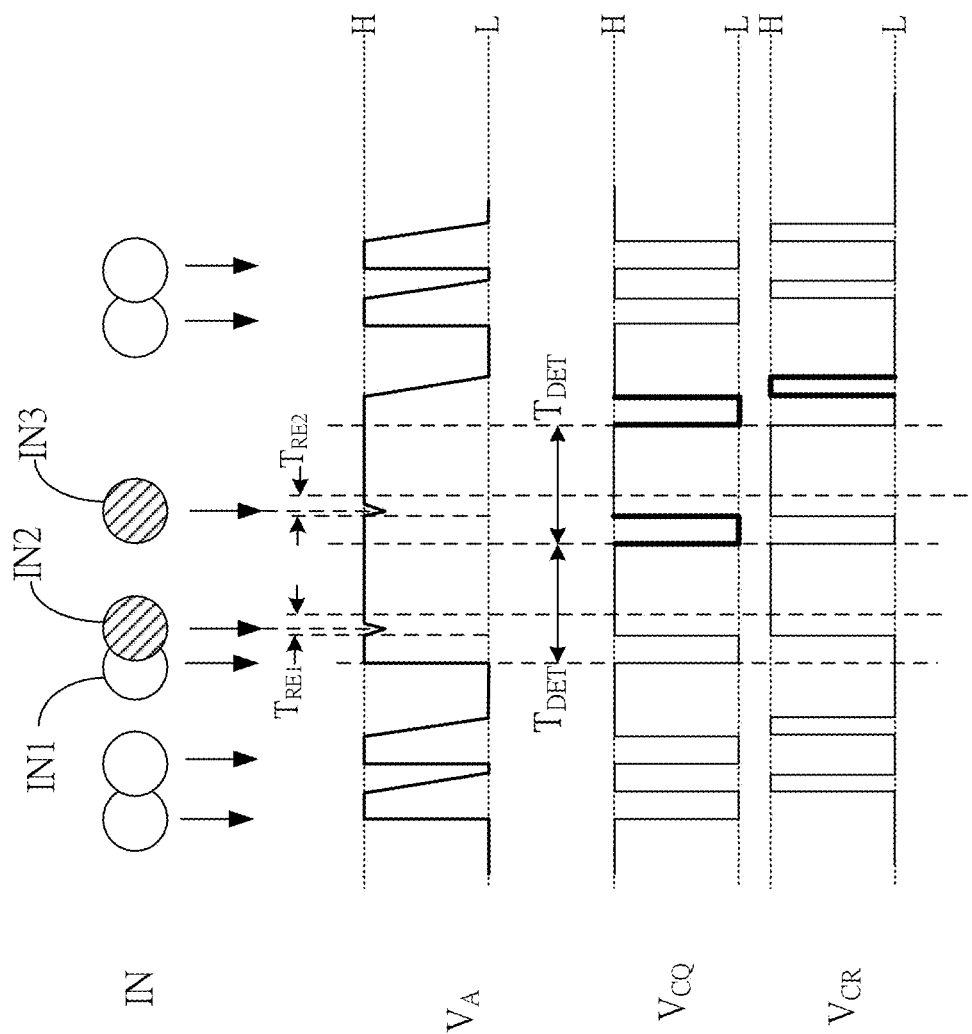
FIG. 8 is a schematic diagram showing the quench control signals and the recharging control signals vs the sensing signals according to another embodiment of the present application.

Refer to FIG. 7 and FIG. 8 for a schematic diagram showing the optical sensing device of another embodiment of the present application and a waveform diagram of the quench control signals and the recharging control signals to the sensing signals. As shown in FIG. 7, according to the present application, an optical sensing device 40 includes an optical sensing element 402, a decision circuit 406, a detection circuit, a control circuit, a quench circuit, and a recharging circuit. The optical sensing device 40 further includes a feedback circuit comprising a first pulse shaping circuit 414, a second pulse shaping circuit 416, and a first logic circuit 418. The detection circuit includes a first one-shot circuit 410 and a first flip-flop 412, and the detection circuit is equivalent to the detection circuit 16 shown in FIG. 1. The control circuit comprises a second one-shot circuit 420 and a second flip-flop 428, and a second logic circuit 430, which is equivalent to the control circuit 18 in FIG. 1. The quench circuit includes a first quench transistor 422 and a second quench transistor 426 while the recharging circuit comprises a recharging transistor 424.

Further, refer to FIG. 7 and FIG. 8 again, a cathode of the optical sensing element 402 is coupled to the bias VBIAS and an anode of the optical sensing element 402 is coupled to the decision circuit 406, the first quench transistor 422, the recharging transistor 424, and the second quench transistor 426. The optical sensing element 402 senses the incident photon IN and generates the corresponding sensing signal $V_A$. In this embodiment, the decision circuit 406 includes two inverters, an even number of the inverters, and thus the output signal $V_{OUT}$ is corresponding to the sensing signal $V_A$, without being inverted. Under normal operation, the optical sensing element 402 triggered by the incident photon IN is quenched by the first quench transistor 422 and then recharged by the recharging transistor 424 so that the voltage level of the optical sensing element 402 returns to the voltage level before being triggered by the incident photon IN. That means the voltage level of the sensing signal $V_A$ is driven to return to its original voltage level before the optical sensing element 402 being triggered by the incident photon IN.

Still refer to FIG. 7 and FIG. 8, an output terminal of the first logic circuit 418 is coupled to a clock input pin CK of the first one-shot circuit 410, an input terminal of the first logic circuit 418 is coupled to the decision circuit 406 through the first pulse shaping circuit 414 for receiving the output signal $V_{OUT}$ and another input terminal of the first logic circuit 418 is coupled to the first flip-flop 412 through the second pulse shaping circuit 416 for receiving the reset signal $V_{RST}$. In this embodiment, the first one-shot circuit 410 is coupled to a clock input pin CK of the first flip-flop 412 by an inverted output pin QB so that the clock input pin CK of the first flip-flop 412 receives the inverted trigger signal $V_{QB}$ directly. Moreover, the first one-shot circuit 410 may be coupled from the output pin Q to the clock input pin CK of the first flip-flop 412 via an inverter. The first pulse shaping circuit 414 and the second pulse shaping circuit 416 are respectively used for shrinking a pulse width of the output signal $V_{OUT}$ and a pulse width of the reset signal $V_{RST}$.

Moreover, reset pins R of the first one-shot circuit 410 and the first flip-flop 412 are coupled to the decision circuit 406. That means the reset pins R of the first one-shot circuit 410 and the first flip-flop 412 are also receiving the output signal $V_{OUT}$. When the output signal $V_{OUT}$ is at the low level L which is 0 in digital signal format, the first one-shot circuit 410 and the first flip-flop 412 are driven to reset.

Thereby, the detection circuit of this embodiment performs feedback detection of the output signals $V_{OUT}$ by the feedback circuit to achieve continuous detection of the output signals $V_{OUT}$. As shown in FIG. 8, the sensing signal $V_A$ drives the control circuit to control the first quench transistor 422 to quench the optical sensing element 402 and control the recharging transistor 424 to recharge the optical sensing element 402 due to a first incident photon IN1 triggering the optical sensing element 402. However, if a second incident photon IN2 continues to trigger the optical sensing element 402 during a first recharging period $T_{RE1}$. At the moment, after the first incident photon IN1 and the second incident photon IN2 continuously trigger the light sensing element 402, a time duration of the sensing signal $V_A$ with the high level H exceeds the trigger time $T_{DET}$. Once the sensing signal $V_A$ persists at the high level H for a longer time duration than the first trigger time $T_{DET}$, the first quench transistor 422 is driven to quench the optical sensing element 402 and the recharging transistor 424 is controlled to recharge the optical sensing element 402. Successively during a second recharging period $T_{RE2}$, a third incident photon IN3 triggers the optical sensing element 402 so that the sensing signal $V_A$ persists at a high level H. Thereby the detection circuit may continuously detect the voltage level of the sensing signal $V_A$ according to the second trigger time $T_{DET}$ via the feedback circuit. When a time duration of the sensing signal $V_A$ with the high level H exceeds the second trigger time $T_{DET}$, the detection circuit generates the corresponding reset signal $V_{RST}$ which drives the control circuit to control the first quench transistor 422 and the recharging transistor 424 through the first logic circuit 418 for quenching and recharging to the optical sensing element 402. Thus, the optical sensing element 402 may return to its original state and be ready for the next triggered by the incident photon IN.

Accordingly, once the optical sensing element 402 is triggered again and again by other incident photons during the recharging period after being triggered by the first incident photon IN1, the voltage level of the sensing signal $V_A$ is continuously detected and reset. In this embodiment, the sensing signal $V_A$ is equivalent to the output signal $V_{OUT}$. Thus, the input terminal of the first logic circuit 418 is coupled to the decision circuit 406 through the first pulse shaping circuit 414 to detect the sensing signal $V_A$ indirectly through the detection of the output signal $V_{OUT}$. Moreover, the input terminal of the first logic circuit 418 may also be coupled to the anode of the optical sensing element 402 for directly receiving the sensing signal $V_A$ so that the detection circuit detects the sensing signal $V_A$ directly.

Following the above, the output terminal of the first logic circuit 418 is further coupled to the control circuit. That means a clock input pin CK of the second one-shot circuit 420 receives the confirmation signal $V_{OR}$ which is corresponding to the output signal $V_{OUT}$ or the reset signal $V_{RST}$. This represents that the first logic circuit 418 receives the output signal $V_{OUT}$ and the reset signal $V_{RST}$ and outputs the corresponding confirmation signal $V_{OR}$ to the control circuit. When the output signal $V_{OUT}$ or the reset signal $V_{RST}$ is changed from the low level L to the high level H, an inverted output terminal QB of the second one-shot circuit 420 is driven to output a quench control signal $V_{CQ}$ to the second flip-flop 428 and the second logic circuit 430, and to the second quench transistor 426 at the same time. Thus the second quench transistor 426 is controlled to be conducting when the quench control signal $V_{CQ}$ is turned to the high level H so that the first quench transistor 422 is further conducting. In this embodiment, the first quench transistor 422 is in a continuously conducting state due to the first quench transistor 422 is coupled to a terminal of a quench bias $V_{BL}$. In this embodiment, quenching of the optical sensing element 402 is performed by control of the second quench transistor 426. The above quench bias $V_{BL}$ may be a constant current bias. For example, a constant current source provided by reference circuit of System-on-Chip (SoC) digital circuit or field-programmable gate array (FPGA) through transistors of a gate and drain short circuit to generate the constant current bias.

Furthermore, after a predetermined hold-off time, the quench control signal $V_{CQ}$ is changed from the low level L to the high level H to drive the second flip-flop 428 to generate a control signal $V_{CT}$ with the high level H according to the power supply voltage VDD and sending the control signal $V_{CT}$ to the second logic circuit 430. Then, the second logic circuit 430 generates the recharging control signal $V_{CR}$ with the high level H according to the quench control signal $V_{CQ}$ and the control signal $V_{CT}$ both with the high level H and then sends the recharging control signal $V_{CR}$ with the high level H to the recharging transistor 424 for recharging of the optical sensing element 402. Thereby the voltage level of the optical sensing element 402 is returned to the voltage level before being triggered by the incident photon IN, such as the low level L. Once the output signal $V_{OUT}$ is returned to the low level L, a reset pin R of the second flip-flop 428 receives the output signal $V_{OUT}$ with the low level L to be reset. Thus the control signal $V_{CT}$ of the second flip-flop 428 is changed into low level L and sent to the second logic circuit 430. Then the second logic circuit 430 generates the recharging control signal $V_{CR}$ with the low level L according to the quench control signal $V_{CQ}$ with the high level H and the control signal $V_{CT}$ with the low level L and the recharging transistor 424 is further turned off. Then the optical sensing element 402 is returned to its original state and ready for the next triggered by the incident photon IN.

In addition, transistors may be used as examples of the first quench transistor 422, the recharging transistor 424, and the second quench transistor 426 for element explanation. In the above embodiment, an OR gate or a logic OR circuit may be used as an example of the first logic circuit 418. An AND gate or a logic AND circuit may be used as an example of the second logic circuit 430.

According to the above embodiments, it is understood that, in the present application, the optical sensing device 40 makes the detection circuit continuously detect the sensing signal $V_A$ through the feedback circuit. Thereby, the dynamic range for light detection and photon count rate under strong ambient light are improved, and the problem of the voltage level latching resulting from the optical sensing element 402 successively triggered by other incident photons IN (such as the third photon IN3) during the second recharging period $T_{RE2}$ is further avoided.

To sum up, the present application provides an optical sensing device sensing an incident photon and correspondingly generating a sensing signal by an optical sensing element. Then, a decision circuit generates an output signal according to the sensing signal, and a detection circuit detects a pulse width of the output signal to generate a corresponding reset signal. Thus, a control circuit is driven to generate a quench control signal and a recharging control signal according to the reset signal for controlling a quench circuit and a recharging circuit. Thereby, a problem of the optical sensing element being unable to respond incident photons to generate sensing signals for a long period once the optical sensing element is triggered by the incident photon during a recharging period may be solved. The dynamic range for light detection and photon count rate under strong ambient light are also improved. Moreover, the optical sensing device comprises a feedback circuit for feedback detection of the sensing signal. Thereby a problem of the optical sensing element being unable to respond incident photons to generate sensing signals for a long period of time once the optical sensing element is triggered by another incident photon during another recharging period may be solved.

The present application meets requirements for patentability including novelty, non-obviousness and usefulness.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. An optical sensing device, comprising:
   an optical sensing element, sensing an incident photon and generating a sensing signal; and
   a detection circuit, coupled to the optical sensing element and detecting a pulse width of the sensing signal, wherein the detection circuit generates a reset signal to reset the optical sensing element when the pulse width of the sensing signal is larger than a threshold value, the detection circuit further comprises a one-shot circuit generating an one-shot signal according to the sensing signal, and the threshold value is determined by a pulse width of the one-shot signal.

2. The optical sensing device as claimed in claim 1, wherein the threshold value is corresponding to a deadtime of the optical sensing element.

3. The optical sensing device as claimed in claim 1, wherein the detection circuit further comprises:
   a flip-flop, generating the reset signal according to the sensing signal and the one-shot signal.

4. The optical sensing device as claimed in claim 1, further comprising:
   a feedback circuit, coupled between an output terminal and an input terminal of the detection circuit.

5. The optical sensing device as claimed in claim 4, wherein the feedback circuit further comprises:
   a first pulse shaping circuit, generating a first pulse shaping signal according to the sensing signal;
   a second pulse shaping circuit, generating a second pulse shaping signal according to the reset signal; and
   a logic circuit, including a first input terminal coupled to the first pulse shaping circuit and receiving an output signal being shaped from the first pulse shaping circuit, a second input terminal of the logic circuit coupled to the second pulse shaping circuit and receiving the reset signal being shaped from the second pulse shaping circuit, and an output terminal of the logic circuit coupled to the input terminal of the detection circuit.

6. The optical sensing device as claimed in claim 5, wherein the first pulse shaping circuit shrinks a pulse width of the output signal, and the second pulse shaping circuit shrinks a pulse width of the reset signal.

7. The optical sensing device as claimed in claim 1, further comprising:
   a control circuit, generating a quench control signal and a recharging control signal according to the reset signal;
   a quench circuit, coupled to the control circuit and the optical sensing element, and quenching the optical sensing element according to the quench control signal; and
   a recharging circuit, coupled to the control circuit and the optical sensing element, and recharging the optical sensing element according to the recharging control signal.

8. The optical sensing device as claimed in claim 7, wherein the control circuit comprises:
   another one-shot circuit, generating the quench control signal according to the reset signal;
   a flip-flop, coupled to the another one-shot circuit, generating a recharging trigger signal according to the quench control signal; and
   a logic circuit, coupled to the another one-shot circuit and the flip-flop, generating the recharging control signal according to the quench control signal and the recharging trigger signal.

9. The optical sensing device as claimed in claim 7, further comprising:
   a decision circuit, generating an output signal according to the sensing signal;
   wherein the control circuit generates the quench control signal and the recharging control signal further according to the output signal.

10. The optical sensing device as claimed in claim 9, wherein the decision circuit comprising at least one inverter.

11. The optical sensing device as claimed in claim 1, wherein the optical sensing element is a single photon avalanche diode having a first electrode coupled to a decision circuit, a quench circuit and a recharging circuit, and the single photon avalanche diode has a second electrode coupled to a bias.

* * * * *